US009547033B1

(12) United States Patent
Batten et al.

(10) Patent No.: US 9,547,033 B1
(45) Date of Patent: Jan. 17, 2017

(54) HIERARCHICAL FAULT PREDICTION, DETECTION AND LOCALIZATION IN PV SYSTEMS WITH DISTRIBUTED ELECTRONICS

(71) Applicant: SunPower Corporation, San Jose, CA (US)

(72) Inventors: Robert Batten, Tualatin, OR (US); Ravindranath Naiknaware, Portland, OR (US)

(73) Assignee: SunPower Corporation, San Jose, CA (US)

( * ) Notice: Subject to any disclaimer, the term of this patent is extended or adjusted under 35 U.S.C. 154(b) by 131 days.

(21) Appl. No.: 13/674,786

(22) Filed: Nov. 12, 2012

Related U.S. Application Data

(60) Provisional application No. 61/559,065, filed on Nov. 12, 2011.

(51) Int. Cl.
*G01R 31/08* (2006.01)
*G01R 31/26* (2014.01)

(52) U.S. Cl.
CPC .............. *G01R 31/08* (2013.01); *G01R 31/26* (2013.01)

(58) Field of Classification Search
CPC . G01R 31/405; G01R 31/2605; G01R 31/025; G01R 31/40; G01R 31/024; G01R 31/1227; G01R 31/02; G01R 31/026; G01R 31/282; G01R 31/025; G01R 31/129; G01R 31/08; H01L 31/02167; H01L 31/02021; G01N 25/72; G01N 21/27; G01N 21/88; G01N 21/27; H02J 3/383; H02J 3/385; H02J 3/38; H02J 7/35; H02M 7/42; H02M 7/44; H02H 1/0015; H02H 1/0023; H02S 50/10; H02S 50/00; Y02E 10/50; Y02E 10/52; Y02E 60/74

See application file for complete search history.

(56) References Cited

U.S. PATENT DOCUMENTS

| | | | |
|---|---|---|---|
| 8,106,537 B2* | 1/2012 | Casey | H01L 31/02021 307/82 |
| 2010/0110742 A1* | 5/2010 | West | 363/132 |
| 2010/0157632 A1* | 6/2010 | Batten et al. | 363/74 |
| 2011/0090089 A1* | 4/2011 | Luo | 340/653 |
| 2012/0048326 A1* | 3/2012 | Matsuo et al. | 136/244 |
| 2012/0065936 A1* | 3/2012 | Singamsetti | 702/183 |
| 2012/0174961 A1* | 7/2012 | Larson et al. | 136/246 |
| 2012/0323507 A1* | 12/2012 | Hasegawa et al. | 702/59 |
| 2013/0015875 A1* | 1/2013 | Kumar | 324/761.01 |
| 2013/0092208 A1* | 4/2013 | Robbins | H01L 31/02021 136/244 |
| 2014/0159763 A1* | 6/2014 | Luo | H02S 10/00 324/761.01 |

* cited by examiner

*Primary Examiner* — Vinh Nguyen
(74) *Attorney, Agent, or Firm* — Boisbrun Hofman, PLLC

(57) ABSTRACT

A method of detecting faults in a solar power system includes monitoring at least one operating parameter including outputs from a solar module, inputs and outputs to a microinverter, and inputs and outputs of a power optimizer, comparing the operating parameter to at least one of an expected value or another operating parameter, using results of the comparing to determine if there is a fault event, analyzing a location of an entity in the system that generated the operating parameter to localize the fault event, and performing remedial action on a location of the fault event.

15 Claims, 1 Drawing Sheet

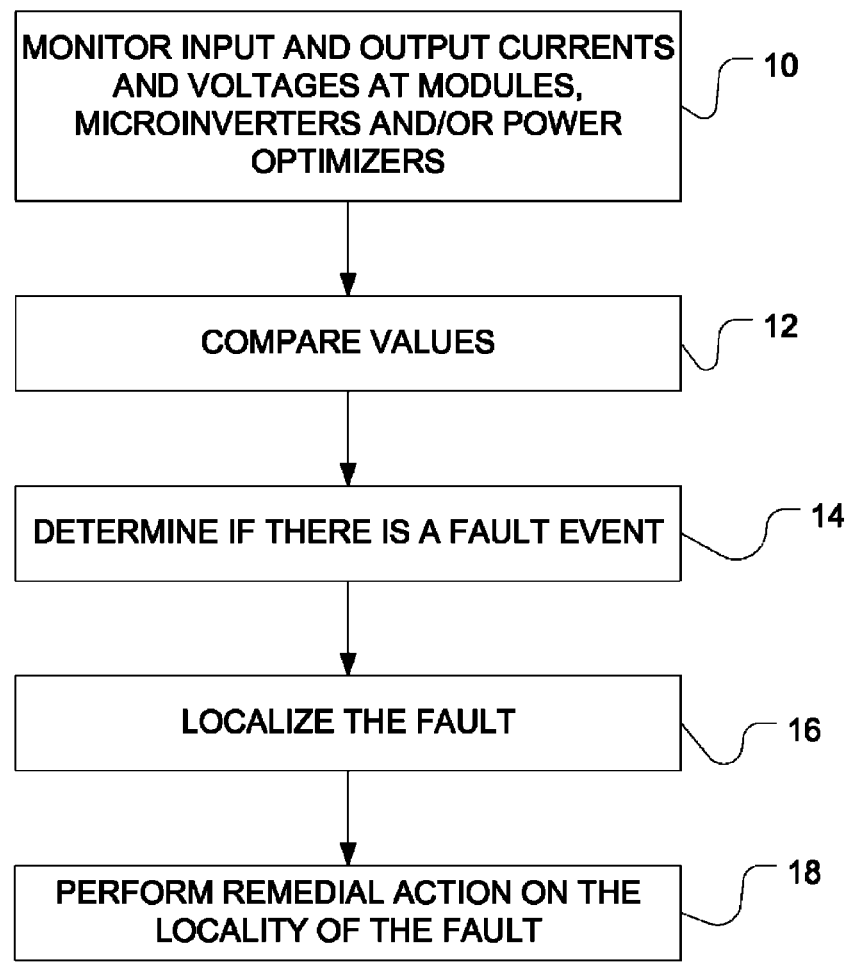

HIERARCHICAL FAULT PREDICTION, DETECTION AND LOCALIZATION IN PV SYSTEMS WITH DISTRIBUTED ELECTRONICS

RELATED APPLICATION

This application claims priority to U.S. Provisional Patent Application 61/559,065, filed Nov. 12, 2011.

BACKGROUND

Incorporation of Ground-Fault Protection Devices (GFPD) for traditional implementation of centralized inverter based photovoltaic (PV) solar energy systems have become mandatory after early incidences of fire which were later shown could be avoided have there been such protective devices installed. Ground Fault Circuit Interrupters (GFCI), Arc Fault Circuit Interrupters (AFCI), Leakage Current Detector Interrupters (LCDI), Equipment Ground Fault Protective Devices (EGFPD), Appliance Leakage Current Interrupters (ALCI) and Immersion Detection Circuit Interrupters (MCI) are used for such protection in a variety of systems. These devices typically sense or determine the leakage current and trigger a safe shut-off and de-energize the system.

Similar studies are being performed for detection and extinguishing of arcs in PV Systems. Arc Fault Circuit Interrupters monitor the current through various paths and voltages at various nodes in the systems, respectively. These signals are first passed through a signal conditioning chain and are digitized through an analog-to-digital converter (ADC). Next, these signals are processed by a digital signal processor (DSP) or custom hardware where it compares with various pre-determined criterion including pre-established signatures to detect an arcing event in the system. If an arcing event is detected systematic automatic triggering of the power switches is accomplished to first extinguish the arc, and then to de-energize the entire system or portions of it.

In traditional solar power plants, where each of the solar modules in a string are connected in series, mismatches among the solar modules lead to degraded performance of total energy harvest. In a typical environment it has been demonstrated that varying shadowing and mismatch related issues among the solar modules lead to up to 25% of lost energy.

Recently, various technologies have been developed to solve these problems. In particular, Microinverter and Power Optimizer technologies improve the system performance by embedding electronics close to each of the solar panels. In the case of microinverters, the energy harvested from the individual solar module is converted to AC, which is suitable for directly feeding into the power system grid. In case of the optimizer, each of the solar modules consists of a DC-DC converter. The outputs of the DC-DC converters are then connected in series to form a string of solar modules, which are then fed into a centralized inverter for converting to AC suitable for feeding into the grid.

In either case of the microinverters and power optimizers, the individual solar modules are decoupled from each other, and are operated at their maximum power point thus allowing maximum possible energy harvest. Each of the solar modules have their individual maximum power point due to their own individual operating conditions specific to the extent to which the solar module is soiled or shadowed.

The microinverter and power optimizer technologies provide further advantage by allowing module level diagnostics and monitoring. Each of the modules can have bi-directional communication capability using either power-line, wireless or traditional wire-line communication technologies. This allows diagnostics and monitoring of various parameters associated with each of the modules and the corresponding electronics. In some cases, the module integrated electronics may have one or many of the following features: communication, diagnostics, monitoring and safety. In such cases, the module electronics are not capable of performing power conditioning for decoupling the solar array string from the module, however, they can continue to perform key GFCI and AFCI Capabilities.

Irrespective of such distributed implementation of various electronic capabilities inside the solar module, GFCI and AFCI techniques have continued to rely on traditional techniques. In such techniques, a combination of DC or AC Disconnect and a Centralized Inverter Integrated or external GFCI device is used to comply with the regulatory code. Such techniques typically have limited resolution thus limit the safety trigger points only to higher values of critical signals. High resolution implementations are available, however, could be inordinately expensive and difficult to install.

BRIEF DESCRIPTION OF THE DRAWINGS

FIG. 1 shows a flowchart of an embodiment of a method to detect and localize faults in solar power systems.

DETAILED DESCRIPTION OF THE EMBODIMENTS

Solar power systems generally consist of at least one, but more likely, an array of solar panels or modules. These panels consist of photovoltaic (PV) cells that convert sunlight incident on them to an output voltage. In some instances, the modules include power optimizers and microinverters that receive and manage the outputs from the PV cells. Typical power optimizers and microinverters incorporate a current sense circuit only on one of the input terminals. The current sense is used for both estimating the input current for sensing and reporting the energy harvest, as well for allowing accurate control of the MPPT algorithms embedded in the power optimizers or the microinverters. However, having a current sense circuit on both of the input terminals would allow estimation of undesirable leakage current which may not be returning to the solar module. If the difference between current arriving and leaving the power optimizer or the microinverter at the input is detected to be higher than pre-determined value, a fault can be created. These faults then can be logged using the microcontroller embedded in the power optimizer or the microinverter, and subsequently may be communicated to an intermediate gateway where it can be processed to trigger appropriate shut-down sequences of the solar plant.

In addition to this, appropriate system alerts can be communicated via Internet or any other means to the appropriate service personnel. Since the fault detection is performed in the solar module, the location of the relevant module where fault was detected is known. This would allow systematic localization of the fault event which can be further analyzed along with the measured current-sense data from all other modules to definitely localize and remedy the cause of the fault.

Since leakage currents in either paths of each of the modules are known, it is further possible to analyze exact leakage and fault current mechanisms in the system allowing automatic and accurate localization and detection of the fault. Furthermore, if the faults are determined to be localized to certain areas of the power plant, only that portion of the power plant can be disabled to allow continual operation of the rest of the power plant which is not affected by the fault.

The methods described above can be further substituted or augmented by an additional current sense circuit on one or either of the output terminals of the power optimizer or the microinverter. Furthermore, additional sensors may be incorporated in situations where there could be multiple references within the system, and could possibly be used to sense the currents and voltages across the capacitors between various references. All measured data can be transmitted to various communicating elements throughout the system and finally to the centralized gateway and/or IP based servers to determine appropriate alerts, remedy, partial or full shutdowns.

A general approach to detecting and localizing a fault is show in FIG. 1. As will be discussed below with regard to each type of fault, various operating parameters such as voltages and currents at the outputs of the solar module, the inputs and outputs of the microinverters and the inputs and outputs of the power optimizers may be monitored by the embedded electronics at 10. The selected values for detection of a particular fault are compared at 12. This allows determination of a fault at 14. The method can then localize the fault at 16 based upon the module, microinverter or power optimizer having the measurement that led to the fault detection, and remedial action, such as an error message, localized shutdown, etc., and be performed at 18.

Solar power plants having power optimizers can perform significantly granular current and voltage measurements at both the input and the output of the solar module power optimizer. Similar granular measurements may be performed with the string of cells within the solar module, and even possibly at the cell level in the future. Additionally, advanced power plants can include additional measurement and diagnostic capability at the solar module strings which are fed into centralized inverters.

In such cases, comparison among the measured currents from the solar module power optimizers and the measured currents at the strings can allow determination of ground faults. Furthermore, the solar module string level current measuring capabilities could optionally include current sensors on both the forward and return path of the solar module string for systematic detection and localization of faults at any hierarchy within the string.

Additionally, such hierarchical capability can be extended up to the centralized inverter, where total current flowing through the centralized inverter or a centralized metering unit is known and can be compared to the total current measured through each of the strings, and next total current flowing through each of the modules. These features allow complete visibility of current flows in the entire plant, thus allowing hierarchical detection and localization of faults through the entire plant. Although in the case of microinverter based systems, the centralized inverter does not exist, with the main difference of the centralized bus being AC, similar techniques can be adopted by incorporating a metering device which almost always must exist for interfacing with the utilities or local energy storage capabilities.

Arc detection of solar plants is performed by sensing currents in the solar module strings, combiner boxes or at collective bus-bars at the centralized inverter. Typically the process involves detection of the pre-assigned high-frequency signatures in the current and voltages of the power lines, and may also include table-based methods where absolute RMS values of voltages and currents are also accounted for in determining a presence of an arc. In the event that such an arc is detected, the power-plant or portions of the power plant are shut down thereby extinguishing the arc. Typically the regulatory codes require that such systems be manually turned on after thorough inspection of the plant.

In the case when the solar modules are integrated with electronics, the module integrated or embedded electronics can continuously monitor the RMS magnitude of the high-frequency energy content at the conductors within the power optimizers. If the energy content at higher frequency is determined to be higher than pre-determined threshold, the system can initiate a sequence to turn-off entire system or portions to extinguish an arc.

However, the above methods can cause false triggering due to inadequacies associated with the traditional approach in creating signatures which may not necessarily encompass site specific scenario. Furthermore, such scenarios occur only after the arcing has already ignited. In such events, localized fault detection can be processed much more intelligently not only locally, but at higher hierarchy to determine the actuality of an arc. The decisions can be made at different levels and be communicated upward and/or downward throughout the hierarchy to take appropriate action.

To accomplish this, the local power optimizers or microinverters determine, e.g., RMS energy in higher-frequencies of the critical power conductors in the power-line. The value of the energy so determined is then transmitted to among other power optimizers and/or to the centralized gateway. The collective amount of RMS energy and its short- and long-term historical progression over time, as well as the number of units reporting critical scenarios along with determination of signatures at the bus-bar, can be intelligently processed to deterministically predict or determine the existence of an arc.

Another advantage arises when the solar modules are integrated or embedded with electronics, the localized monitoring can quickly determine localized by-pass diode failures within the solar modules. Typically, the by-pass diodes fail due to abnormal events such lightning or overheating. Most often the diodes fail 'short', meaning they lose their diode like functionality and behave like a low value resistor. In such an event, when the corresponding solar module is illuminated with solar irradiation, depending on the number of strings of cells within the solar module, the output voltage will consistently be lower by a fixed value equivalently corresponding to the number of failed sub-strings within the module.

Sometimes, however, such a failure is indistinguishable from shadowing events, especially those related to random events such as randomly falling debris staying mostly static over the panel. Such examples include bird droppings and falling leaves. In such an event, if the "array cleaned" trigger is embedded in the centralized intelligence, which would be set after the array is cleaned. It would allow determination of diode failures.

With 'open' failures of the diode, where the by-pass diode act like an open-circuit, the determination of the failure is compounded by normal open circuit operational behavior of diode and are hard to diagnose. To remedy these, smart diagnostic circuits can be embedded within the power optimizers where by-pass diodes can be quickly tested for their functionality when low or no irradiation is present.

Poor connection can be detected by correlating distributed measurements of currents and voltages within the solar plant. The correlating elements could consist of one or many of the elements constituting the measured current and voltages at cells, sub-strings within the module, the string of modules, centralized inverter and or centralized metering units. Generally, poor connections would show to be either completely open, or could yield as a high resistivity element within the system. Either of these can be determined by systematically correlating and accounting for various voltages and currents in the system. Unusually large voltage drops from various elements in the hierarchy could determine and localize poor connections within the system.

The methods described above rely upon detection of trigger points in the inputs and outputs in the system. This can be further refined when the fault currents are smaller than the trigger points. Similar constraints can also be applied to trigger points associated with the absolute or differential voltage monitors. Alternative monitoring parameters can include RMS or spectral characteristics of the high-frequency content of the signal on the key conductors. Although such fault parameters can be small during normal operation, these can be continuously monitored for any accentuation using periodic statistical estimation. Any changes beyond statistical variation can be attributed to a worsening situation at one or many points in the solar power plant, such as slow moisture ingress into various key elements such as solar panels, distributed electronics or connectors. Such refinements allow continuous forward prediction of future faulty events including ground faults, arc faults, diode failures, and worsening electrical connections so that the corresponding issues can be diagnosed and addressed before the fault events occur, thus eliminating or minimizing prospective downtime of the solar power plant.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of detecting faults in a solar power system comprising a solar module including a microinverter or a power optimizer, comprising:
    monitoring an operating parameter including outputs from the solar module, inputs to or outputs of the microinverter, or inputs to or outputs of the power optimizer;
    comparing a historical progression over time of the operating parameter to a pre-determined criterion;
    using results of the comparing for determining if there is a fault event;
    analyzing a location in the solar power system that generated the operating parameter to localize the fault event; and
    performing a remedial action on the location of the fault event.

2. The method as recited in claim 1 further comprising logging the fault event.

3. The method as recited in claim 1 further comprising triggering a shut-down sequence of at least a portion of the solar power system at the location of the fault event.

4. The method as recited in claim 1 wherein performing the remedial action comprises providing an alert at an occurrence of the fault event.

5. The method as recited in claim 1 wherein performing the remedial action comprises providing an error message describing the fault event.

6. The method as recited in claim 1 wherein determining if there is the fault event comprises determining if there is an arc fault.

7. The method as recited in claim 1 wherein determining if there is the fault event comprises determining if there is a ground fault.

8. The method as recited in claim 1 wherein determining if there is the fault event comprises determining if there is a poor electrical connection within the solar power system.

9. The method as recited in claim 1 wherein determining if there is the fault event comprises determining if there is a by-pass diode failure within the solar module.

10. The method as recited in claim 1 wherein monitoring the operating parameter comprises monitoring RMS energy in higher frequencies of power conductors associated with the solar module, the microinverter or the power optimizer.

11. The method as recited in claim 1 wherein the outputs from the solar module, the inputs to or the outputs of the microinverter, or the inputs to or the outputs of the power optimizer represent locations for trigger points in the solar power system.

12. The method as recited in claim 1 further comprising providing a forward prediction of a future fault event in the solar power system by monitoring changes beyond a statistical variation of the operating parameter.

13. The method as recited in claim 1 wherein monitoring the operating parameter is executed by the solar module and at least one of (i) comparing the historical progression over time of the operating parameter, (ii) using the results of the comparing, (iii) analyzing the location in the solar power system or (iv) performing the remedial action is executed by a gateway.

14. The method as recited in claim 1 further comprising integrating the microinverter or the power optimizer within the solar module.

15. The method as recited in claim 1 wherein the solar power system comprises a plurality of solar modules each having a microinverter or a power optimizer, and monitoring the operating parameter, comparing the historical progression over time of the operating parameter, using the results of the comparing, analyzing the location in the solar power system and performing the remedial action is performed on the plurality of solar modules.

* * * * *